(12) United States Patent
Kawasaki et al.

(10) Patent No.: US 11,303,141 B2
(45) Date of Patent: Apr. 12, 2022

(54) PROTECTION CIRCUIT FOR BATTERY AND POWER SUPPLY DEVICE PROVIDED WITH SAID PROTECTION CIRCUIT

(71) Applicant: SANYO Electric Co., Ltd., Daito (JP)

(72) Inventors: Tetsuya Kawasaki, Osaka (JP); Hisashi Kameyama, Osaka (JP); Naoki Kawai, Hyogo (JP); Takahiro Yamashita, Hyogo (JP)

(73) Assignee: SANYO Electric Co., Ltd., Daito (JP)

( * ) Notice: Subject to any disclaimer, the term of this patent is extended or adjusted under 35 U.S.C. 154(b) by 163 days.

(21) Appl. No.: 16/629,766

(22) PCT Filed: Jul. 12, 2018

(86) PCT No.: PCT/JP2018/026260
§ 371 (c)(1),
(2) Date: Jan. 9, 2020

(87) PCT Pub. No.: WO2019/017263
PCT Pub. Date: Jan. 24, 2019

(65) Prior Publication Data
US 2020/0235591 A1 Jul. 23, 2020

(30) Foreign Application Priority Data
Jul. 19, 2017 (JP) .............................. JP2017-139680

(51) Int. Cl.
*H02J 7/00* (2006.01)
(52) U.S. Cl.
CPC ........ *H02J 7/0031* (2013.01); *H02J 7/00302* (2020.01); *H02J 7/00306* (2020.01); *H02J 7/007182* (2020.01)
(58) Field of Classification Search
USPC ................................................. 320/134, 136
See application file for complete search history.

(56) References Cited

U.S. PATENT DOCUMENTS 5,959,436 A * 9/1999 Takashina ........ G01R 19/16542
320/134
5,990,663 A * 11/1999 Mukainakano ....... H02J 7/0068
320/134

(Continued)

FOREIGN PATENT DOCUMENTS

| JP | 2000-166108 A | 6/2000 |
| JP | 2007-124768 A | 5/2007 |
| JP | 2009-296873 A | 12/2009 |

OTHER PUBLICATIONS

Translation of International Search Report dated Aug. 7, 2018, issued in counterpart Application No. PCT/JP2018/026260. (1 page).

*Primary Examiner* — Samuel Berhanu
(74) *Attorney, Agent, or Firm* — Westerman, Hattori, Daniels & Adrian, LLP

(57) ABSTRACT

A protection circuit for a battery includes a discharge FET, a control circuit, a first small-signal FET, and a second small-signal FET. The discharge FET connected in series to a battery interrupts an electric current. The control circuit switches on or off the discharge FET. The first small-signal FET connected in parallel between a gate (G) and a source (S) of the discharge FET is switched to an ON state, to set a gate voltage of the discharge FET to an OFF-state voltage. The second small-signal FET connected in parallel between G and S of the discharge FET detects a voltage between a drain (D) and S of the discharge FET. When the voltage between D and S of the discharge FET exceeds a preset voltage, the second small-signal FET is switched to an ON state to set the gate voltage of the discharge FET to the OFF-state voltage.

7 Claims, 4 Drawing Sheets

(56) References Cited

U.S. PATENT DOCUMENTS

| | | | |
|---|---|---|---|
| 9,065,281 B2 * | 6/2015 | Sakurai | H02J 7/0034 |
| 9,917,451 B2 * | 3/2018 | Kim | H02J 7/0031 |
| 2009/0295334 A1 * | 12/2009 | Yang | H02J 7/0031 |
| | | | 320/134 |
| 2010/0194346 A1 * | 8/2010 | Lee | H02J 7/00302 |
| | | | 320/134 |
| 2016/0315487 A1 | 10/2016 | Shim | |

* cited by examiner

PROTECTION CIRCUIT FOR BATTERY AND POWER SUPPLY DEVICE PROVIDED WITH SAID PROTECTION CIRCUIT

TECHNICAL FIELD

The present invention relates to a protection circuit for a battery which detects an abnormal state of the battery or a load and switches off a discharge field effect transistor (FET) connected in series to the battery, thereby interrupting an electric current. Furthermore, the present invention relates to a power supply device with the protection circuit.

BACKGROUND ART

Battery packs that have been developed are equipped with protection circuits. A protection circuit has a discharge FET connected in series to batteries and, if any abnormality occurs, interrupts an electric current to or from the batteries (refer to PTL 1).

The battery pack, as described above, includes: the discharge FET and a charge FET that are both connected in series to the batteries; and a control circuit that switches on or off each of the discharge FET and the charge FET. The control circuit detects an abnormal state of the battery or a load and, when an abnormality occurs, switches the discharge FET to an OFF state to interrupt an electric current or switches the charge FET to an OFF state to interrupt a charge electric current.

CITATION LIST

Patent Literature

PTL 1: Unexamined Japanese Patent Publication No. 2009-296873

SUMMARY OF THE INVENTION

A battery pack with a protection circuit, as described above, has a control circuit that detects an abnormal state of batteries or a load. When determining that the batteries or the load is in an abnormal state where an electric current should be interrupted, the control circuit applies an OFF-state voltage to a gate of a discharge FET, thereby switching this discharge FET to an OFF state. However, a delay time is generated at a timing when the control circuit applies the OFF-state voltage to the discharge FET and the discharge FET is thereby switched off. This delay time is prolonged as capacitance at an input of the discharge FET increases, in other words, as output impedance of the control circuit increases. The discharge FET, when being in an ON state, accumulates electric charge in proportion to a product of the input capacitance and an input voltage. To discharge this electric charge, the control circuit outputs an OFF signal so that a gate voltage of the discharge FET decreases to an OFF-state voltage. A time required to discharge the electric charge that has been accumulated in the capacitance of the discharge FET in the ON state is prolonged in proportion to the output impedance of the control circuit. Therefore, if the control circuit has a high output impedance, it takes a considerably long time to discharge the electric charge, in other words, to decrease the gate voltage of the discharge FET to the OFF-state voltage. In response to the decrease in the gate voltage to the OFF-state voltage, the discharge FET is switched to the OFF state. Thus, a temporal delay by which the electric charge is discharged from the capacitance until the gate voltage decreases to the OFF-state voltage corresponds to a delay time in which the discharge FET is switched to the OFF state. Actually, it is possible to shorten the delay time of the discharge FET by decreasing the output impedance of the control circuit. However, characteristics (e.g., internal resistance) of general-purpose integrated circuits (ICs) determine a switching-off capacity of FETs. By adding an external resistor, resistance of the general-purpose IC can be increased, but a decrease in the resistance involves a modification of the IC, which may lead to cost increase. Furthermore, a speed in this case also depends on input capacitance of FETs and a number of FETs connected in parallel. Therefore, it is difficult to adjust the speed with the general-purpose ICs having fixed characteristics.

The delay time in which the discharge FET is switched off may hinder rapid interruption of the electric current, thus risking safety. Moreover, this delay time may cause damage to the discharge FET, because peak power of the discharge FET extremely increases. In short, at a timing when the discharge FET is switched from the ON state to the OFF state, power loss may instantaneously and extremely increase. In fact, while the discharge FET is in the ON or OFF state, the power loss can be kept low, but at the timing when the discharge FET is switched from the ON state to the OFF state, the power loss may sharply increase. A reason is that the power loss increases in proportion to a product of a square of the electric current and the internal resistance. When the discharge FET is in the ON state, the internal resistance becomes substantially zero ohm, whereas when the discharge FET is in the OFF state, the internal resistance becomes substantially infinity. In either of these two states, the power loss becomes low. In contract, at the timing when the discharge FET is switched from the ON state to the OFF state, the gate voltage gradually decreases but the internal resistance gradually increases. During this period, the internal resistance may turn out a cause of the power loss. For this reason, during the delay time in which the discharge FET is switched to the OFF state, the internal resistance and the power loss instantaneously increase, thus causing damage to the discharge FET.

The present invention is developed to solve conventional disadvantages as described above. An important object of the present invention is to provide a highly safe protection circuit that can rapidly switch a discharge FET to an OFF state by using one or more low-power FETs and can reliably reduce the risk of the discharge FET damaged due to power loss upon switching. Another important object of the present invention is to provide a power supply device with this protection circuit.

A protection circuit for a battery according to an aspect of the present invention includes a discharge FET, a control circuit, a first small-signal FET, and a second small-signal FET. The discharge FET that is connected in series to a battery interrupts an electric current discharged from the battery. The control circuit switches on or off the discharge FET. The first small-signal FET that is connected in parallel between G and S of the discharge FET is switched to an ON state, in response to an ON signal supplied from the control circuit, to set a gate voltage of the discharge FET to an OFF-state voltage. The second small-signal FET that is connected in parallel between G and S of the discharge FET detects a voltage between D and S of the discharge FET. When the voltage between D and S of the discharge FET exceeds a preset voltage, the second small-signal FET is switched to an ON state to set the gate voltage of the discharge FET to the OFF-state voltage.

The above protection circuit has a merit of providing a high level of safety, because the protection circuit can rapidly switch a discharge FET to an OFF state by using one or more low-power FETs and can reliably reduce the risk of the discharge FET damaged due to power loss upon switching. More specifically, this protection circuit includes a first small-signal FET and a second small-signal FET. The First small-signal FET is connected in parallel between G and S of a discharge FET and is switched to an ON state by a control circuit to set a gate voltage of the discharge FET to an OFF-state voltage. The second small-signal FET is connected in parallel between G and S of the discharge FET and, when a voltage between D and S of the discharge FET exceeds a preset voltage, is switched to the ON state to set the gate voltage of the discharge FET to the OFF-state voltage.

When the control circuit interrupts a battery electric current flowing through the protection circuit, the first small-signal FET is switched to the ON state to short-circuit G and S of the discharge FET. In response, the gate voltage of the discharge FET is lowered rapidly to the OFF-state voltage, and the discharge FET is thereby switched to the OFF state. In addition, when the voltage between D and S of the discharge FET that has been switched to the OFF state exceeds the preset voltage, the second small-signal FET is switched to the ON state to short-circuit G and S of the discharge FET. In this way, the gate voltage of the discharge FET can be maintained in the OFF-state voltage. In short, when the control circuit interrupts the battery electric current flowing through the protection circuit, the first small-signal FET is switched to the ON state to rapidly lower the gate voltage of the discharge FET to the OFF-state voltage. After the discharge FET has been switched to the OFF state, when the voltage between D and S of the discharge FET exceeds the preset voltage, the second small-signal FET is switched to the ON state to maintain the gate voltage of the discharge FET to the OFF-state voltage. Consequently, it is possible to interrupt the discharge FET rapidly and maintain this discharge FET in the OFF state, thereby protecting the battery.

Upon switching of the discharge FET, both the first small-signal FET and the second small-signal FET can lower the gate voltage of the discharge FET rapidly to the OFF-state voltage, thereby switching the discharge FET to the OFF state. Consequently, it is possible to decrease power loss caused due to a delay time generated when the discharge FET is switched to the OFF state, thereby reliably reducing the risk of the discharge FET damaged.

A protection circuit for a battery according to another aspect of the present invention may further include a third small-signal FET that is disposed at an input of the second small-signal FET and connected between D and S of the discharge FET. The third small-signal FET may switch the second small-signal FET to the OFF state in response to an OFF signal supplied to a gate of the third small-signal FET.

The above protection circuit includes a third small-signal FET that is disposed at an input of the second small-signal FET and connected between D and S of the discharge FET. This third small-signal FET switches second small-signal FET to the OFF state in response to an OFF signal supplied to a gate of the third small-signal FET. Thus, after the second small-signal FET has been switched to the ON state based on detection of a voltage between D and S of the discharge FET in the OFF state, the third small-signal FET can switch this second small-signal FET to the OFF state. As a result, the short circuit of the G and S of the discharge FET is released, and the discharge FET is switched to the ON state in response to the ON signal from the control circuit, thereby permitting discharging.

A protection circuit for a battery according to another aspect of the present invention may further include an input circuit that supplies the OFF signal to the gate of the third small-signal FET.

The above configuration can control an input circuit that supplies the OFF signal to the gate of the third small-signal FET in such a way that the third small-signal FET is switched to the OFF state and the second small-signal FET is switched to the OFF state. In this way, this configuration controls the input circuit in such a way that the second small-signal FET enters the OFF state, thereby enabling the control circuit to effectively control the discharge FET so as to be switched to the ON state.

In a protection circuit for a battery according to another aspect of the present invention, the control circuit may include a first control circuit and a second control circuit. When detecting a current interruption state where a battery electric current is to be interrupted, the first control circuit may output an OFF signal to the discharge FET. When detecting the current interruption state, the second control circuit may output an ON signal to the first small-signal FET. In response to the OFF signal output from the first control circuit, the discharge FET may be switched to the OFF state. In response to the ON signal output from the second control circuit, the first small-signal FET may be switched to the ON state, and the first small-signal FET in the ON state may switch the discharge FET to the OFF state.

In the above configuration, the control circuit includes a first control circuit and a second control circuit. When detecting a current interruption state, the first control circuit outputs an OFF signal to the discharge FET, whereas when detecting the current interruption state, the second control circuit outputs an ON signal to the first small-signal FET. This configuration can easily adjust a speed at which the discharge FET switches off, independently of characteristics of the first control circuit. Even if the first control circuit is implemented by a general-purpose integrated circuit (IC), the above configuration can cause the second control circuit to control the first small-signal FET, thereby easily adjusting a speed at which the discharge FET switches off independently of a switching-off capacity of FETs of the general-purpose IC.

In a protection circuit for a battery according to another aspect of the present invention, the first control circuit or the second control circuit may detect at least one of battery information and load information and may detect the current interruption state.

The above configuration detects the current interruption state by detecting an abnormality of a battery detected from the battery information or an abnormality of a load acquired from the load information. Thus, when an abnormality occurs in the battery or the load, the configuration can switch the discharge FET rapidly to the OFF state, thereby reliably interrupting the discharge electric current.

In a protection circuit for a battery according to another aspect of the present invention, the discharge FET may include a plurality of power metal oxide semiconductor (MOS) FETs connected in parallel to one another.

The configuration in which the discharge FET includes the plurality of power MOSFETs connected in parallel to one another feeds decreased amounts of electric currents to the individual discharge FETs. Thus, the configuration can use less expensive FETs each having a small permissible electric current to allow a large total amount of permissible electric current to flow through the FETs. Even if an increased number of FETs connected in parallel are used, it is possible to adjust the speed at which the FETs switch off by adjusting a speed at which electric charge is removed from the first small-signal FET.

A protection circuit for a battery according to another aspect of the present invention may further include a charge FET connected in series to the discharge FET. The charge FET may be controlled by control circuit 5.

A power supply device according to an aspect of the present invention includes any one of the protection circuits described above.

DESCRIPTION OF EMBODIMENTS

Exemplary embodiments of the present invention will be described below with reference to the drawings. However, the foregoing exemplary embodiments illustrate concrete examples of technical ideas of the present invention, and accordingly the present invention is not limited to the description below. Further, in the present description, components described in the scope of claims are not limited to the components of the exemplary embodiments. In particular, it is not intended to limit the scope of the present invention to the sizes, materials, and shapes of components and relative arrangement between the components, which are described in the exemplary embodiments, unless otherwise specified. The sizes and the like are mere explanation examples. Note that the sizes and the positional relation of the components in each drawing are exaggerated for clearing the explanation in some cases. Furthermore, in the following description, the same names or the same reference marks denote the same components or the same types of components, and detailed description is therefore appropriately omitted. Regarding the elements constituting the present invention, a plurality of elements may be formed of the same component, and one component may serve as the plurality of elements. To the contrary, the function of one component may be shared by the plurality of components.

Figure 1:
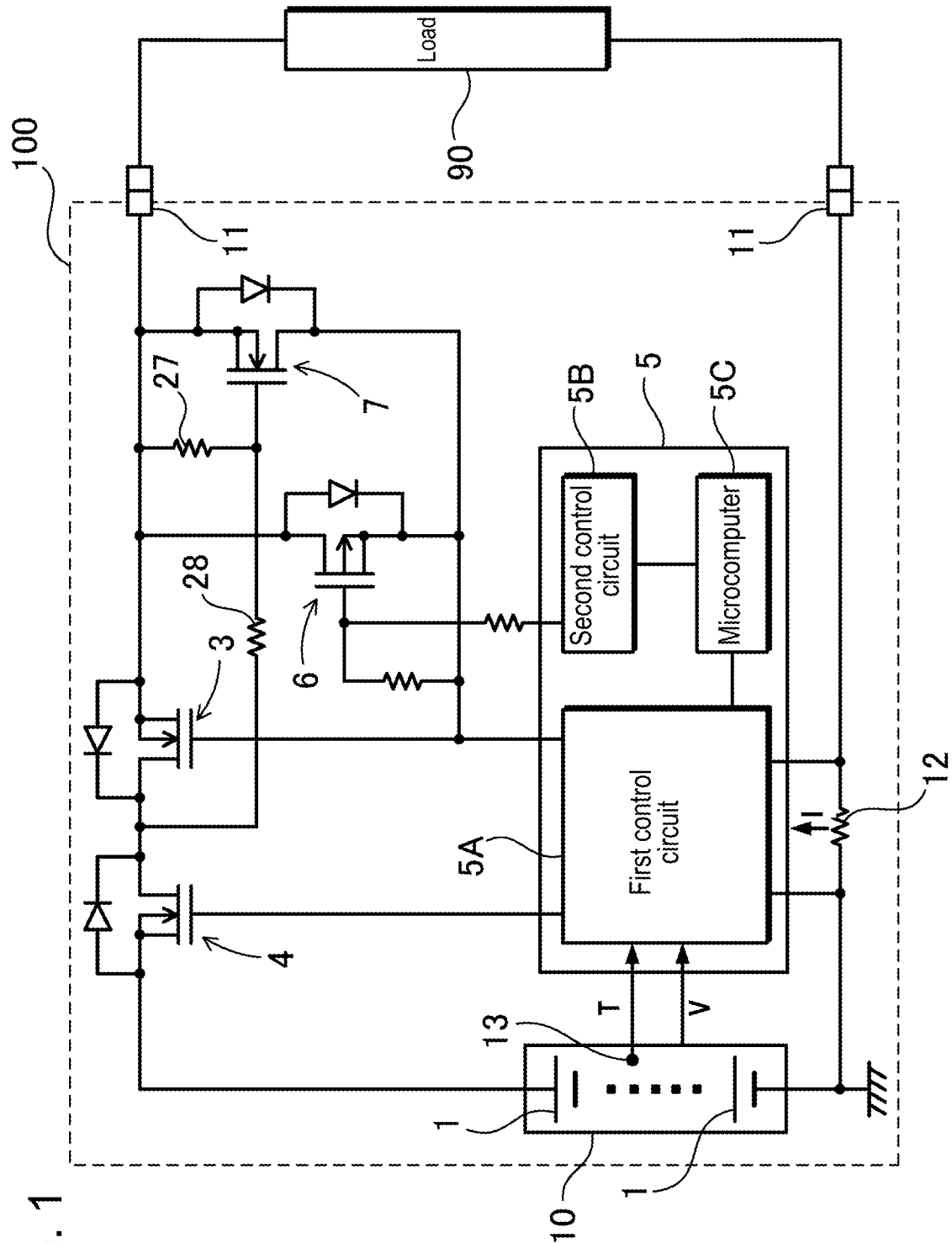
FIG. 1 is a schematic block diagram of a power supply device with a protection circuit for a battery, according to an exemplary embodiment of the present invention.
Figure 2:
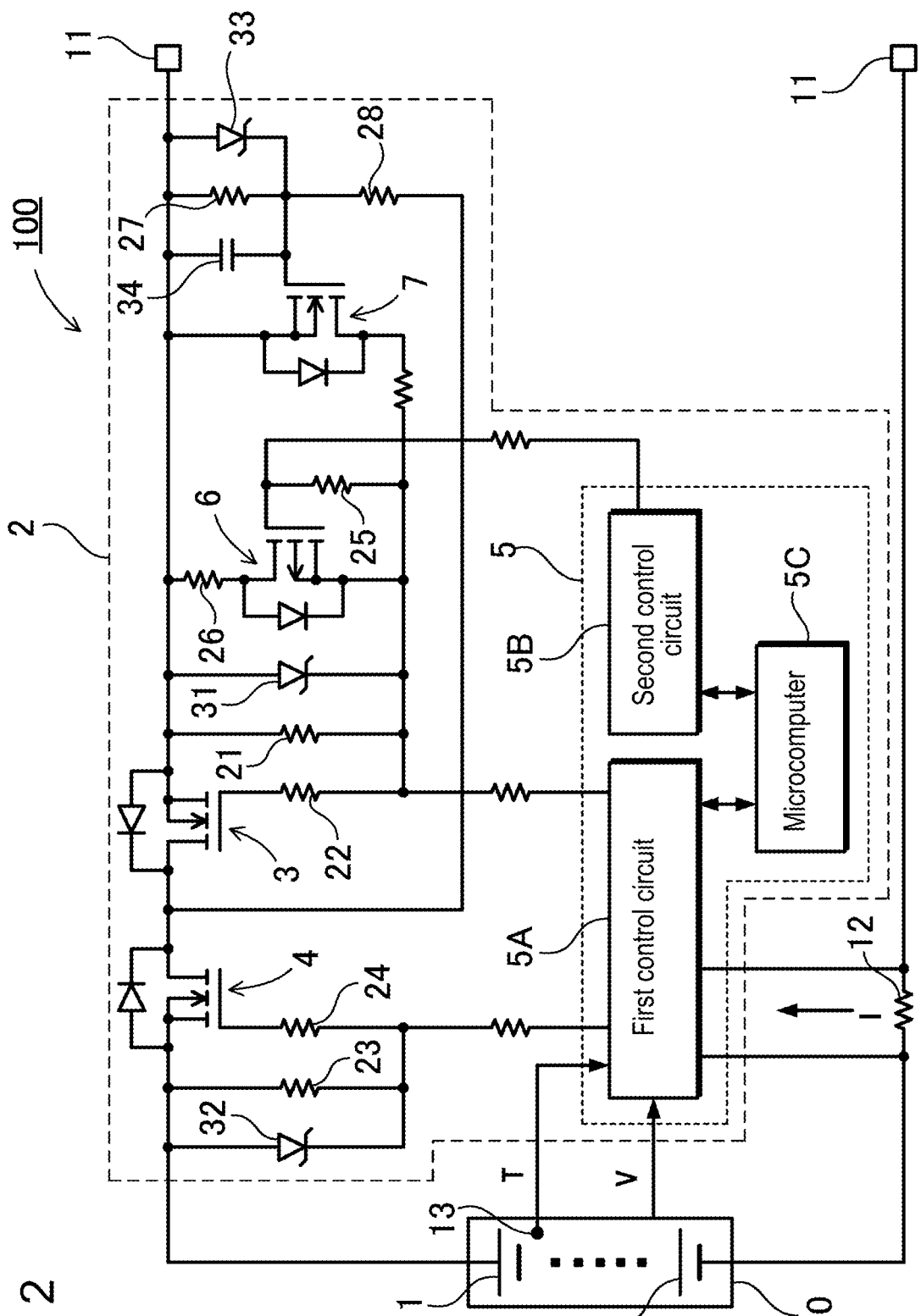
FIG. 2 is a circuit block diagram of the power supply device illustrated in FIG. 1.

FIGS. 1 and 2 each illustrate a power supply device with a protection circuit for a battery, according to an exemplary embodiment of the present invention. Power supply device 100 illustrated in these drawings includes: batteries 1, discharge field effect transistor (FET) 3, control circuit 5, and protection circuit 2. Each of batteries 1 is of a chargeable and dischargeable type. Discharge FET 3 is connected in series to batteries 1 and interrupts an electric current discharged from batteries 1. Control circuit 5 switches on or off discharge FET 3. Protection circuit 2, in a current interruption state where a battery electric current is to be interrupted, interrupts the discharge electric current by switching discharge FET 3 to an OFF state. Power supply device 100 illustrated in the drawings further includes charge FET 4 connected in series to batteries 1. Charge FET 4 interrupts a charge electric current to batteries 1. Control circuit 5 also switches on or off charge FET 4.

(Batteries 1)

Each of batteries 1 is a chargeable and dischargeable, secondary battery. Power supply device 100 uses lithium ion secondary batteries as batteries 1. The lithium ion secondary battery has a high charge and discharge capacity relative to its capacity and weight. Thus, using the lithium ion secondary batteries can achieve a small-sized, lightweight power supply device that has a high charge and discharge capacity. Instead of the lithium ion secondary batteries, the power supply device of the present invention may use any other chargeable and dischargeable secondary batteries. Power supply device 100 illustrated in FIGS. 1 and 2 is equipped with a plurality of batteries 1, which are connected in series to constitute battery block 10. Although the plurality of batteries 1 are connected in series in battery block 10 illustrated in the drawings, a number of batteries connected and a connection state of batteries are not limited in the present invention. The battery block may include a plurality of batteries connected both in parallel and in series.

(Discharge FET 3)

Discharge FET 3, which is formed at an output of batteries 1, is connected in series between batteries 1 and output terminal 11. When an over-discharge state of batteries 1 is detected, discharge FET 3 is switched to an OFF state, thereby interrupting the electric current discharged from batteries 1. For example, discharge FET 3 may be a power metal oxide semiconductor (MOS) FET. Discharge FET 3 illustrated in the drawings, which is an N-channel power MOSFET, has a drain connected to batteries 1, a source connected to output terminal 11, and a gate connected to control circuit 5. In addition, connected between the drain and source (referred to below as between D and S) of discharge FET 3 is a parasitic diode. This parasitic diode is connected orientated such that the charge electric current is permitted but the discharge electric current is interrupted.

As illustrated in FIG. 2, both first resistor 21 and Zener diode 31 are connected in parallel between the gate and source (referred to below as between G and S) of discharge FET 3. Zener diode 31 is disposed such that a gate voltage between G and S becomes a predetermined voltage. Both first resistor 21 and Zener diode 31 connected in parallel between G and S are connected to the gate of discharge FET 3 via second resistor 22, which serves as a gate resistor. Discharge FET 3 is switched on when receiving an ON signal at a "High" level from control circuit 5, and is switched off when receiving an OFF signal at a "Low" level from control circuit 5.

(Charge FET 4)

Charge FET 4 is disposed between batteries 1 and output terminal 11 and connected in series to discharge FET 3. When an overcharge state of batteries 1 is detected, charge FET 4 is switched to an OFF state, thereby interrupting the charge electric current to batteries 1. For example, charge FET 4 may be a power MOSFET. Charge FET 4 illustrated in the drawings, which is an N-channel power MOSFET, has a drain connected to output terminal 11, a source connected to batteries 1, and a gate connected to control circuit 5. In addition, connected between D and S of charge FET 4 is a parasitic diode. This parasitic diode is connected orientated such that the discharge electric current is permitted but the charge electric current is interrupted.

Both third resistor 23 and Zener diode 32 are connected in parallel between G and S of charge FET 4 illustrated in FIG. 2. Zener diode 32 is disposed such that a gate voltage between G and S becomes a predetermined voltage. Both third resistor 23 and Zener diode 32 connected in parallel between G and S are connected to the gate of charge FET 4 via fourth resistor 24, which serves as a gate resistor. Charge FET 4 is switched on when receiving the ON signal at a "High" level from control circuit 5, and is switched off when receiving the OFF signal at a "Low" level from control circuit 5.

Discharge FET 3 and charge FET 4 disposed in the above manner are connected in series and in opposite orientations. Control circuit 5 controls the ON or OFF state of each of discharge FET 3 and charge FET 4, depending on a charge or discharge state of batteries 1. Discharge FET 3 is switched off to stop charging of batteries 1, whereas the charge FET is switched off to stop discharging of batteries 1. While batteries 1 are being charged or discharged, both discharge FET 3 and charge FET 4 are maintained in the ON state.

In power supply device 100 illustrated in FIGS. 1 and 2, discharge FET 3 is connected in series to charge FET 4 on an output line at the output of batteries 1. Power supply device 100 feeds a charge or discharge electric current via discharge FET 3 and charge FET 4 connected in series. Therefore, each of discharge FET 3 and charge FET 4 needs to permit a maximum charge or discharge electric current that battery block 10 including the plurality of batteries 1 can output. In this case, since power supply device 100 with battery block 10 in which the plurality of batteries 1 are connected in series can feed large amounts of maximum charge and discharge electric currents, both of discharge FET 3 and charge FET 4 need to permit a large amount of electric current. In general, an FET that permits a large amount of electric current is expensive and has high input capacitance, which may involve using an insulating circuit configuration. However, by using a general-purpose IC (a control circuit with a CP), this circuit configuration can be made simple. Moreover, since a capacity of power supply device 100 depends on characteristics of the IC, a second control circuit is added as will be described later.

In a power supply device, each of a discharge FET and a charge FET disposed on the output line may be formed of a plurality of unillustrated power MOSFETs connected in parallel. This configuration enables FETs with a low maximum permitted electric current, in other words, less expensive FTTs to be used, thereby contributing to decreased manufacturing cost. This is because the charge or discharge electric current flowing along the output line can be separated into small amounts of electric currents individually flowing through the plurality of FETs connected in parallel which constitute each of the discharge FET and the charge FET.

(Control Circuit 5)

Control circuit 5 controls a charge or discharge state of batteries 1 by controlling the ON and OFF states of discharge FET 3 and charge FET 4. In addition, when detecting the current interruption state where the battery electric current is to be interrupted, control circuit 5 switches discharge FET 3 to the OFF state. Control circuit 5 detects information on batteries 1 that is being charged or is discharging. Based on this battery information, control circuit 5 controls the charging or discharging of batteries 1 and detects the current interruption state of batteries 1. The current interruption state, discussed herein, where the battery electric current is to be interrupted refers to a state where an excessively large amount of electric current is flowing through batteries 1, for example, due to an abnormality of batteries 1 or load 90 connected to output terminal 11 of power supply device 100 or refers to a state where it is preferable for the battery electric current to be interrupted, for example, due to an abnormal increase in battery temperature. Control circuit 5 detects this current interruption state as battery or load information. As an example, the abnormality of load 90 may be a short circuit in load 90. If the (internal) short circuit occurs in load 90, an excessively large amount of discharge electric current may flow through batteries 1. Therefore, when detecting an excessively large amount of discharge electric current, control circuit 5 detects the current interruption state as an abnormality of batteries 1 or load 90.

Control circuit 5 includes first control circuit 5A that controls the charge or discharge state of batteries 1 by detecting a battery voltage, a charge or discharge electric current, and a battery temperature as the battery information. When detecting the charge or discharge state of batteries 1 from the detected battery information, first control circuit 3 switches on or off discharge FET 3 and charge FET 4. First control circuit 5A includes an unillustrated detector, controller, and communication unit. The detector detects a voltage or voltages across batteries 1, an electric current flowing through batteries 1, a temperature of batteries 1, and other factors. The controller controls the ON and OFF states of discharge FET 3 and charge FET 4, based on the battery information detected by the detector. The communication unit transmits the detected battery information to microcomputer 5C. The detector detects individual voltages (V) across each of batteries 1 connected in series or an entire voltage (V) across battery block 10 in which batteries 1 are connected in series. In addition, the detector detects the charge or discharge electric current (I) by detecting a voltage across current detection resistor 12 connected in series to the output line of batteries 1. Moreover, the detector detects the battery temperature (T) from a signal supplied from temperature sensor 13 that is disposed so as to be thermally coupled to batteries 1.

The controller determines a state of batteries 1 from the battery voltage, electric current, temperature, and other factors detected by the detector. When batteries 1 can be charged or discharge normally, the controller switches both discharge FET 3 and charge FET 4 to the ON state. When batteries 1 cannot be used normally, the controller switches discharge FET 3 or charge FET 4 to the OFF state. For example, if detecting that batteries 1 excessively discharge in the discharge state, the controller outputs the OFF signal to discharge FET 3, thereby switching discharge FET 3 to the OFF state. In which case, the discharge electric current is interrupted. If detecting that batteries 1 is excessively charged in the charge state, the controller outputs the OFF signal to charge FET 4, thereby switching off charge FET 4 to the OFF state. In which case, the charge electric current is interrupted.

Control circuit 5 further includes second control circuit 5B that, when detecting the current interruption state, switches discharge FET 3 to the OFF state. Second control circuit 5B detects the current interruption state by detecting at least one of the battery information and the load information. When microcomputer 5C and other protection functions detect an abnormality, second control circuit 5B can perform a protection operation independently of an operation of first control circuit 5A. To switch discharge FET 3 to the OFF state, second control circuit 5B does not necessarily have to directly output the OFF signal to discharge FET 3. Alternatively, second control circuit 5B may control first small-signal FET 6 that will be described later. As described above, control circuit 5 includes first control circuit 5A, second control circuit 5B, and microcomputer 5C. First control circuit 5A detects the battery information and, based on this information, controls the charge or discharge state of batteries 1 by switching on or off discharge FET 3 and charge FET 4. Second control circuit 5B controls ON and OFF states of first small-signal FET 6. Microcomputer 5C controls both first control circuit 5A and second control circuit 5B.

(Protection Circuit 2)

In addition to discharge FET 3 that interrupts the electric current discharged from batteries 1 in the current interruption state and control circuit 5 that switches on or off discharge FET 3, protection circuit 2 illustrated in FIGS. 1 and 2 further includes first small-signal FET 6 and second small-signal FET 7. First small-signal FET 6 is connected in parallel between G and S of discharge FET 3 and is switched to the ON state in response to the OFF signal supplied from control circuit 5, thereby setting the gate voltage of discharge FET 3 to an OFF-state voltage. Second small-signal FET 7 is connected in parallel between G and S of discharge FET 3 and detects a voltage between D and S of discharge FET 3. When the voltage between D and S of discharge FET 3 exceeds a preset voltage, second small-signal FET 7 switches to the ON state to set the gate voltage of discharge FET 3 to the OFF-state voltage.

When control circuit 5 detects the current interruption state where the battery electric current is to be interrupted, protection circuit 2 switches discharge FET 3 to the OFF state, thereby interrupting the discharge electric current. Further, in response to detection of the current interruption state, protection circuit 2 switches discharge FET 3 to the OFF state, thereby interrupting the discharge electric current. When protection circuit 2 controls discharge FET 3 so as to switch to the OFF state, if first control circuit 5A solely switches discharge FET 3 to the OFF state as described above, it takes a considerably long time to decrease the gate voltage of discharge FET 3 to the OFF-state voltage, because electric charge accumulated in capacitance of discharge FET 3 cannot be discharged briefly. A delay time in which discharge FET 3 is switched off may cause an excessive increase in peak power of discharge FET 3, which causes damage to discharge FET 3. In short, if discharge FET 3 performs a switching operation when batteries 1 are in a normal state, an electric current value is kept within a normal range, in which case the delay time is less likely to cause damage to discharge FET 3. However, if an excessively large amount of electric current flows as in the current interruption state, the delay time in which discharge FET 3 is switched off is highly likely to cause damage to discharge FET 3. For this reason, protection circuit 2 is equipped with first small-signal FET 6 connected in parallel between G and S of discharge FET 3. First small-signal FET 6 accelerates the switching of discharge FET 3 to the OFF state when the current interruption state is detected.

(First Small-Signal FET 6)

First small-signal FET 6 illustrated in FIG. 2, which is a P-channel FET, has a source connected to the gate of discharge FET 3, a drain connected to the source of discharge FET 3, and a gate connected to control circuit 5. The gate of first small-signal FET 6 is connected to the gate of discharge FET 3 via fifth resistor 25. In response to an ON signal supplied from second control circuit 5B, first small-signal FET 6 is switched to an ON state. When receiving the ON signal at a "Low" level from second control circuit 5B, a voltage across fifth resistor 25 is applied to first small-signal FET 6 as a gate voltage, so that first small-signal FET 6 is switched to the ON state. When first small-signal FET 6 is switched to the ON state, G and S of discharge FET 3 are short-circuited, and electric charge accumulated in the capacitance of discharge FET 3 is thereby discharged rapidly. As a result, the gate voltage of discharge FET 3 decreases to the OFF-state voltage briefly, so that discharge FET 3 is switched briefly to the OFF state.

In protection circuit 2 illustrated in the drawings, sixth resistor 26 is connected in series to first small-signal FET 6 in order to adjust a time in which the electric charge accumulated in the capacitance of discharge FET 3 is discharged. A resistance value of sixth resistor 26 is adjusted to optimize the time in which discharge FET 3 switches from the ON state to the OFF state. Specifically, the resistance value of sixth resistor 26 may be adjusted such that the time in which discharge FET 3 switches from the ON state to the OFF state becomes preferably 1 msec or less, or more preferably 100 μsec or less.

As described above, when detecting the current interruption state, protection circuit 2 switches discharge FET 3 to the OFF state. For this purpose, first control circuit 5A outputs the OFF signal to discharge FET 3, and simultaneously second control circuit 5B outputs the ON signal to first small-signal FET 6, thereby switching first small-signal FET 6 to the ON state. As a result, the gate voltage of discharge FET 3 decreases rapidly to the OFF-state voltage, and discharge FET 3 is thereby switched rapidly to the OFF-state voltage.

To switch discharge FET 3 to the OFF state in response to detection of the current interruption state, protection circuit 2 does not necessarily have to simultaneously operate both first control circuit 5A and second control circuit 5B. Alternatively, protection circuit 2 may make a setting of preferentially operating second control circuit 5B alone, namely, a setting of preferentially short-circuiting G and S of discharge FET 3. In this case, it is necessary to set a capability for second control circuit 5B to switch off discharge FET 3 to higher than a capability for first control circuit 5A to switch on discharge FET 3. This configuration, regardless of whether first control circuit 5A outputs the ON or OFF signal to discharge FET 3, enables second control circuit 5B to output the ON signal to first small-signal FET 6 to switch first small-signal FET 6 to the ON state. In response, G and S of discharge FET 3 are short-circuited, and discharge FET 3 is thereby switched to the OFF state. In this way, when the current interruption state is detected, second control circuit 5B may preferentially operate to switch off discharge FET 3. This configuration enables second control circuit 5B to perform the protection function alone when discharge FET 3 is protected so as to satisfy a request for an FET switching-off speed or even if a microcomputer or a first control circuit fails to operate properly. Consequently, it is possible to provide improved safety. Even after second control circuit 5B has operated to switch first small-signal FET 6 to the ON state, first control circuit 5A preferably controls discharge FET 3 so as to enter the OFF state. In this way, first control circuit 5A can suppress discharge FET 3 from being accidentally switched to the ON state.

Second control circuit 5B controls first small-signal FET 6 so as to enter the ON state. In response, G and S of discharge FET 3 are short-circuited, and discharge FET 3 is thereby switched rapidly to the OFF state. However, when first small-signal FET 6 in the ON state short-circuits G and S of first small-signal FET 6, the gate voltage of discharge FET 3 is lowered toward 0 V, in which case a drive voltage for first small-signal FET 6 is also lowered so that it is difficult to maintain first small-signal FET 6 in the ON state. When first small-signal FET 6 enters the OFF state, discharge FET 3 is no longer maintained in the OFF state. Discharge FET 3 that is not maintained in the OFF state is disadvantageously unstable. For this reason, protection circuit 2 includes second small-signal FET 7 connected in parallel between G and S of discharge FET 3. Second small-signal FET 7 continuously maintains discharge FET 3 in the OFF state after the discharge FET 3 has been switched to the OFF state. Further, a voltage between D and S of discharge FET 3 is divided, and a divided voltage is applied to an input of second small-signal FET 7.

(Second Small-Signal FET 7)

Second small-signal FET 7 illustrated in FIG. 2, which is an N-channel FET, has a drain connected to the gate of discharge FET 3, a source connected to the source of discharge FET 3, and a gate connected between D and S of discharge FET 3. This gate serves as a terminal at which the voltage between D and S of discharge FET 3 is detected. When discharge FET 3 is switched to the OFF state, its resistance increases, and an electric potential difference between a battery output and output terminal 11 is thereby generated between D and S of discharge FET 3. When the voltage between D and S of discharge FET 3 that has been switched to the OFF state exceeds the preset voltage, second small-signal FET 7 is switched to an ON state. This is because a voltage divided by resistors disposed in series between D and S of discharge FET 3 is applied to second small-signal FET 7 as a gate voltage.

In protection circuit 2 illustrated in the drawings, a series circuit formed of seventh resistor 27 and eighth resistor 28 is connected between D and S of discharge FET 3, and a midpoint between seventh resistor 27 and eighth resistor 28 is connected to the gate of second small-signal FET 7, which corresponds to a detection point of a voltage of discharge FET 3. Seventh resistor 27 that is connected between G and S of second small-signal FET 7 divides the voltage to be applied between D and S of discharge FET 3 and applies the divided voltage to second small-signal FET 7 as a gate voltage. Thus, when the voltage between D and S of discharge FET 3 exceeds the preset voltage, the gate voltage is applied to second small-signal FET 7, and second small-signal FET 7 is thereby switched to the ON state.

Protection circuit 2 illustrated in the drawings has Zener diode 33 and capacitor 34 connected between G and S of second small-signal FET 7 and in parallel to the seventh resistor. Zener diode 33 is disposed such that a gate voltage between G and S becomes a predetermined voltage. Even after the voltage between D and S of discharge FET 3 has decreased below the preset voltage, capacitor 34 continues to function as a delay circuit over a predetermined time. This delay circuit applies the gate voltage between G and S of second small-signal FET 7. Protection circuit 2 can cause the delay circuit to retain the gate voltage of second small-signal FET 7 to maintain second small-signal FET 7 in the ON state over the predetermined time, even when the voltage between D and S of discharge FET 3 becomes equal to or less than the preset voltage, for example, due to detaching of load 90 from power supply device 100.

When the voltage between D and S of discharge FET 3 exceeds the preset voltage, second small-signal FET 7 is switched to the ON state, and then protection circuit 2 configured above maintains discharge FET 3 in the OFF state. This is because the output voltage across batteries 1 is connected to output terminal 11 via the series circuit formed of seventh resistor 27 and eighth resistor 28 disposed between D and S of discharge FET 3. As described above, after discharge FET 3 has been switched to the OFF state in response to the detection of the current interruption state, second small-signal FET 7 is maintained in the ON state. This structure suppresses discharge FET 3 from returning to the ON state, thereby ensuring safety. For example, when outputs of power supply device 100 are short-circuited, if discharge FET 3 is switched to the ON state, an excessively large amount of electric current may flow to risk safety. For this reason, once discharge FET 3 is switched to the OFF state in response to the detection of the current interruption state, discharge FET 3 is preferably maintained so as not to return to the ON state.

Protection circuit 2 configured above switches off discharge FET 3 in a manner that will be described below.

(1) When control circuit 5 detects, from the battery or load information, the current interruption state where the battery electric current is to be interrupted, second control circuit 5B outputs the ON signal to first small-signal FET 6. Before or after this operation, first control circuit 5A preferably outputs the OFF signal to discharge FET 3.

(2) In response to reception of the ON signal, first small-signal FET 6 is switched to the ON state, thereby short-circuiting G and S of discharge FET 3.

(3) In response to short-circuiting of G and S of first small-signal FET 6 in the ON state, the gate voltage of discharge FET 3 is lowered rapidly to the OFF-state voltage, and discharge FET 3 is thereby switched rapidly to the OFF state to interrupt the discharge electric current.

(4) In response to switching of discharge FET 3 to the OFF state, a resistance increases, and an electric potential difference is thereby generated between D and S of discharge FET 3. When the voltage between D and S of discharge FET 3 exceeds the preset voltage, a voltage divided by resistors disposed in series between D and S of discharge FET 3 is applied to second small-signal FET 7 as a gate voltage.

(5) In response to detection of the gate voltage, second small-signal FET 7 is switched to the ON state, thereby short-circuiting G and S of discharge FET 3. Since second small-signal FET 7 in the ON state short-circuits G and S of discharge FET 3, discharge FET 3 is maintained in the OFF state. More specifically, as long as discharge FET 3 is in the OFF state, the electric potential difference is continuously generated, by the battery voltage, between D and S of discharge FET 3. Therefore, second small-signal FET 7 is maintained in the ON state.

In the above way, when the current interruption state where the battery electric current is to be interrupted is detected, first small-signal FET 6 is switched to the ON state to lower the gate voltage of discharge FET 3 rapidly to the OFF-state voltage, thereby switching discharge FET 3 rapidly to the OFF state. After discharge FET 3 has been switched to the OFF state, when the voltage between D and S of discharge FET 3 becomes equal to or more than the preset voltage, the second small-signal FET is switched to the ON state to continuously maintain discharge FET 3 in the OFF state. As a result, a state of interrupting the electric current is continued.

When detecting the current interruption state, power supply device 100 switches off discharge FET 3 and then maintains discharge FET 3 in the OFF state. For example, as long as second small-signal FET 7 is in the ON state, discharge FET 3 is not switched to the ON state even when receiving the ON signal from first control circuit 5A. This is because the voltage generated between D and S of discharge FET 3 causes second small-signal FET 7 to be maintained in the ON state, and then second small-signal FET 7 in the ON state keeps short-circuiting G and S of discharge FET 3. For this reason, after second small-signal FET 7 has been switched on, control circuit 5 may stop outputting the ON signal to first small-signal FET 6.

To return discharge FET 3 to the ON state again, power supply device 100 needs to switch second small-signal FET 7 to the OFF state. For example, power supply device 100 can switch off second small-signal FET 7 by charging batteries 1. More specifically, when batteries 1 are charged, a voltage higher than the battery voltage is applied to output terminal 11. As a result, the electric potential difference between D and S of discharge FET 3 is eliminated. After second small-signal FET 7 has been released from the ON state as a result of the application of charge voltage to output terminal 11, when second control circuit 5B outputs the OFF signal to first small-signal FET 6, and first control circuit 5A outputs the ON signal to discharge FET 3, discharge FET 3 is switched to the ON state. In this way, power supply device 100 enters a state where the discharge electric current is permitted.

After discharge FET 3 has been switched to the OFF state to interrupt the discharge electric current, power supply device 100 configured above applies a predetermined voltage to output terminal 11, thereby lowering the voltage between D and S of discharge FET 3 to the preset voltage or less. In response, second small-signal FET 7 is switched to the OFF state, and discharge FET 3 is thereby switched to the ON state. However, after the discharge FET has been switched to the OFF state to interrupt the discharge electric current, in some cases, the power supply device needs to operate to switch the discharge FET to the ON state without applying the voltage to the output terminal. For example, this operation is needed when an operation of the discharge FET is checked or a discharge state of the power supply device is tested upon, for example, installation of a power supply device.

Other Exemplary Embodiments

Figure 3:
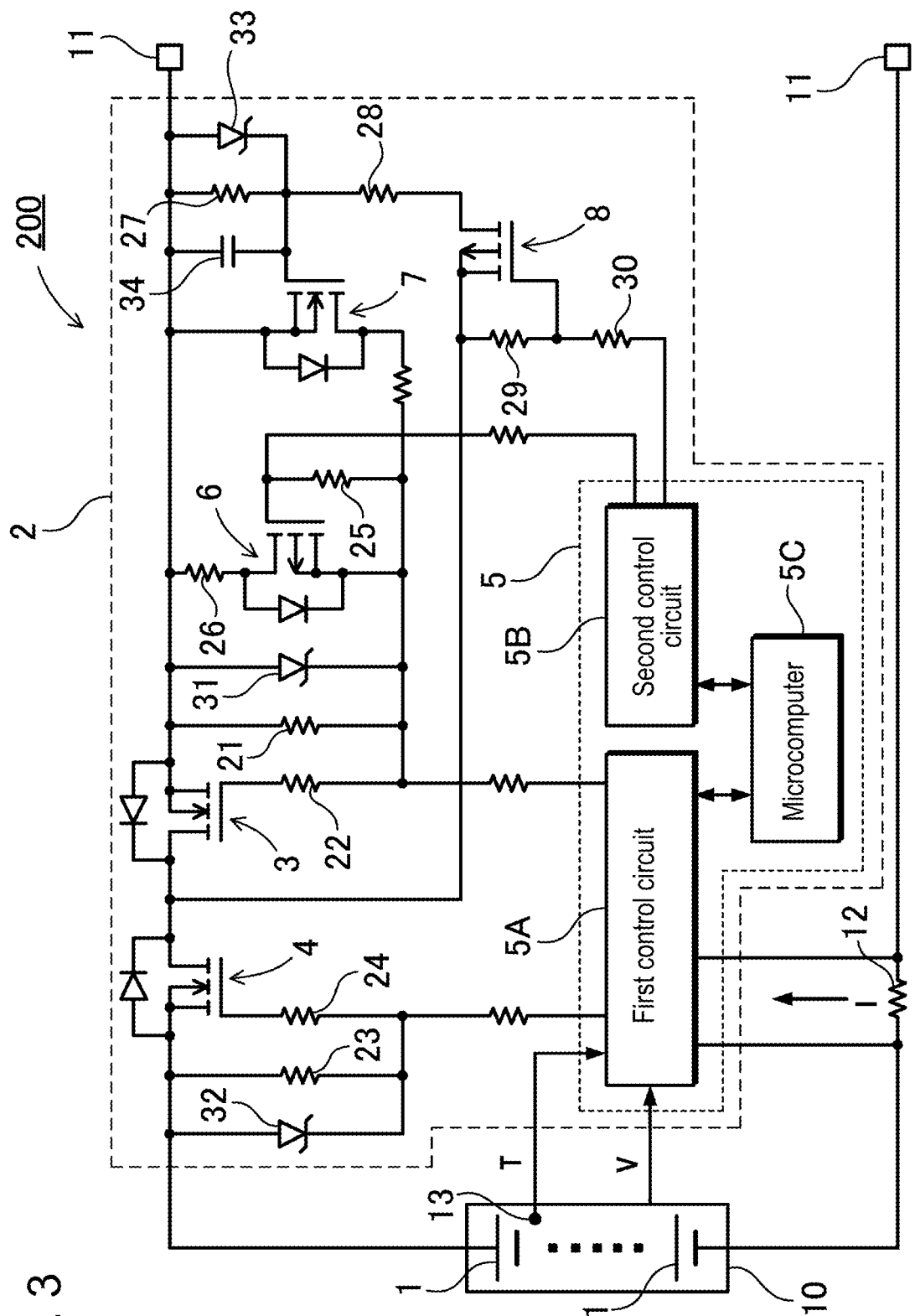
FIG. 3 is a schematic block diagram of a power supply device with a protection circuit for a battery, according to another exemplary embodiment of the present invention.
Figure 4:
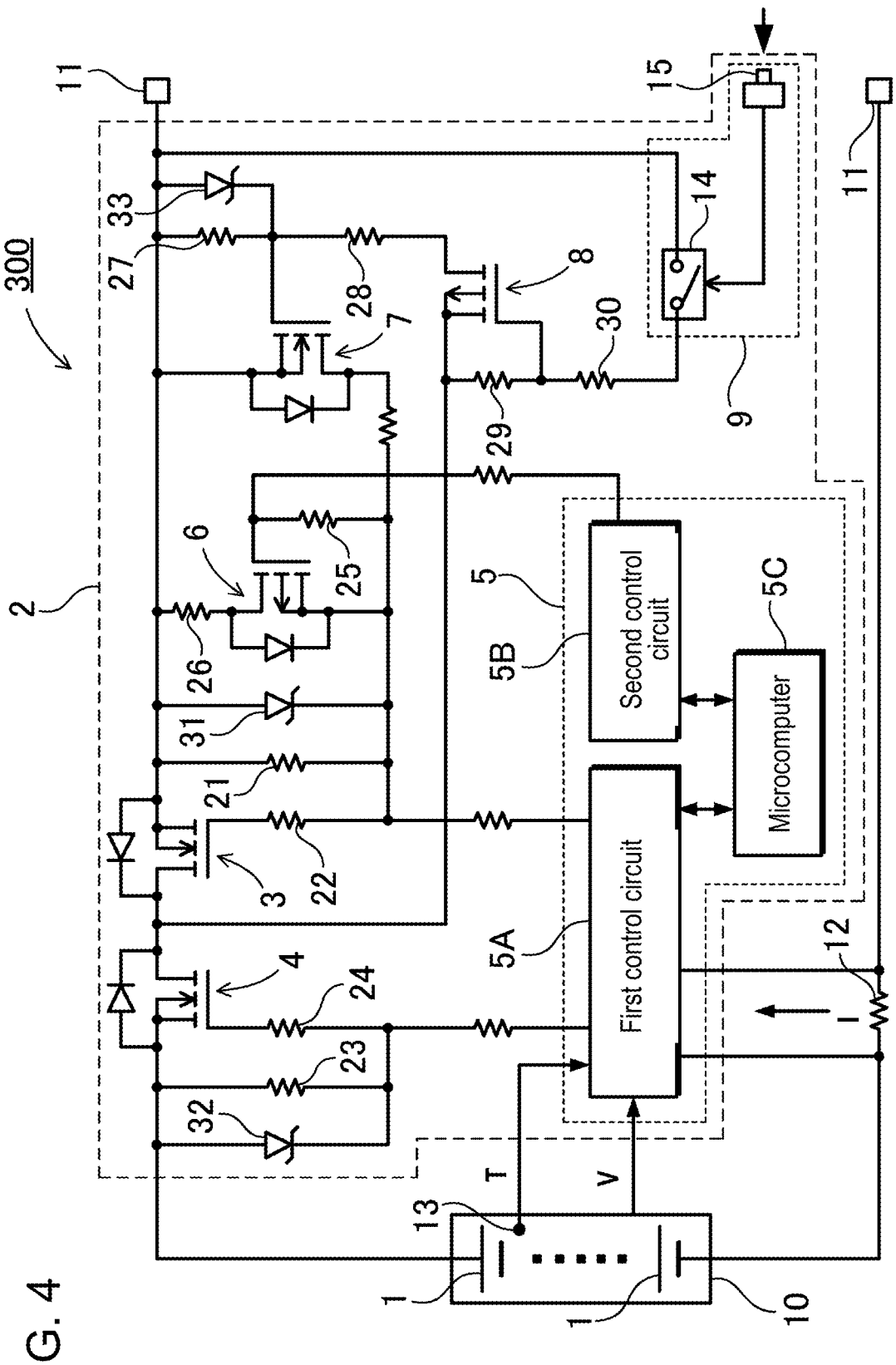
FIG. 4 is a schematic block diagram of a power supply device with a protection circuit for a battery, according to still another exemplary embodiment of the present invention.

Power supply devices 200, 300 illustrated in FIGS. 3 and 4 each further include third small-signal FET 8 that is disposed at an input of second small-signal FET 7 and connected between D and S of discharge FET 3. Third small-signal FET 8 switches second small-signal FET 7 to an OFF state. In each of protection circuits 2 illustrated in these drawings, third small-signal FET 8 is connected in series between D and S of discharge FET 3. Third small-signal FET 8, which is a P-channel FET, has a source connected to a drain of discharge FET 3 and a drain connected to a source (output terminal 11) of discharge FET 3.

In addition, a signal to be supplied to the gate controls the ON and OFF states of third small-signal FET 8.

In power supply device 200 illustrated in FIG. 3, the gate of third small-signal FET 8 is input into control circuit 5. Protection circuit 2 includes: ninth resistor 29 connected between G and S of third small-signal FET 8; and tenth resistor 30 via which the gate of third small-signal FET 8 is input into control circuit 5. In this circuit configuration, third small-signal FET 8 is switched on when receiving an ON signal at a "Low" level from control circuit 5 and switched off when receiving an OFF signal at a "High" level from control circuit 5. When control circuit 5 outputs the ON signal to third small-signal FET 8, a divided voltage generated at ninth resistor 29 is applied between G and S of third small-signal FET 8 as a gate voltage. As a result, in power supply device 200, when control circuit 5 outputs the ON signal to third small-signal FET 8, third small-signal FET 8 is switched to the ON state, and second small-signal FET 7 is thereby maintained in the ON state. When control circuit 5 outputs the OFF signal to third small-signal FET 8, third small-signal FET 8 is switched to the OFF state, and second small-signal FET 7 is thereby switched to the OFF state. However, it should be noted that an input of second small-signal FET 7 illustrated in the drawing is provided with a delay circuit formed of capacitor 34. After third small-signal FET 8 has been switched to the OFF state, this delay circuit maintains second small-signal FET 7 in the ON state over a predetermined time.

Power supply device 300 illustrated in FIG. 4 is provided with input circuit 9 that supplies an OFF signal to the gate of third small-signal FET 8. By operating input switch 9 in power supply device 300, second small-signal FET 7 is switched to the OFF state. Protection circuit 2 in the drawing includes: ninth resistor 29 connected between G and S of third small-signal FET 8; and a series circuit formed of tenth resistor 30 and open or close switch 14 via which the gate of third small-signal FET 8 is connected to the source (output terminal 11) of discharge FET 3. Power supply device 300 is provided with external switch 15 outside, which controls the ON and OFF states of open or close switch 14. In power supply device 300, open or close switch 14 and external switch 15 provided at the gate of third small-signal FET 8 constitute input circuit 9.

When external switch 15 in input circuit 9 is operated, open or close switch 14 is switched to the OFF state, whereas when external switch 15 is not operated, open or close switch 14 is switched to the ON state. When external switch 15 is not operated in protection circuit 2, the divided voltage generated at ninth resistor 29 is applied between G and S of third small-signal FET 8 as the gate voltage. Third small-signal FET 8 is thereby switched to the ON state, and second small-signal FET 7 is maintained in the ON state. When external switch 15 is operated in protection circuit 2, open or close switch 14 is opened, and no gate voltage is applied to ninth resistor 29. Third small-signal FET 8 is thereby switched to the OFF state, and second small-signal FET 7 is switched to the OFF state.

INDUSTRIAL APPLICABILITY

The present invention is applicable suitably to power supplies for stationary power storage facilities and backup power supplies for various battery devices.

The invention claimed is:

1. A protection circuit for a battery comprising:
   a discharge field effect transistor (FET) that interrupts an electric current discharged from the battery, the discharge FET being connected in series to the battery;
   a control circuit that switches on or off the discharge FET;
   a first small-signal FET that, in response to an ON signal supplied from the control circuit, is switched to an ON state to set a gate voltage of the discharge FET to an OFF-state voltage, the first small-signal FET being connected in parallel between a gate (G) and a source (S) of the discharge FET; and
   a second small-signal FET that detects a voltage between a drain (D) and the S of the discharge FET and, when the voltage between the D and the S of the discharge FET exceeds a preset voltage, is switched to an ON state to set the gate voltage of the discharge FET to the OFF-state voltage, the second small-signal FET being connected in parallel between the G and the S of the discharge FET.

2. The protection circuit for the battery according to claim 1, further comprising a third small-signal FET that is disposed at an input of the second small-signal FET and connected between the D and the S of the discharge FET, wherein the third small-signal FET switches the second small-signal FET to the OFF state in response to an OFF signal supplied to a gate of the third small-signal FET.

3. The protection circuit for the battery according to claim 2, further comprising an input circuit that supplies the OFF signal to the gate of the third small-signal FET.

4. The protection circuit for the battery according to claim 1, wherein the control circuit includes a first control circuit that, when detecting a current interruption state where a battery electric current is to be interrupted, outputs an OFF signal to the discharge FET, and a second control circuit that, when detecting the current interruption state, outputs an ON signal to the first small-signal FET, in response to the OFF signal output from the first control circuit, the discharge FET is switched to the OFF state, and in response to the ON signal output from the second control circuit, the first small-signal FET is switched to the ON state, and the first small-signal FET in the ON state switches the discharge FET to the OFF state.

5. The protection circuit for the battery according to claim 4, wherein the first control circuit or the second control circuit detects at least one of battery information and load information and detects the current interruption state.

6. The protection circuit for the battery according to claim 1 further comprising a charge FET connected in series to the discharge FET, the charge FET being controlled by the control circuit.

7. A power supply device comprising the protection circuit according to claim 1.

* * * * *